United States Patent [19]

Headrick et al.

[11] Patent Number: 4,755,422
[45] Date of Patent: Jul. 5, 1988

[54] MULTILAYERED ELECTRONICS PROTECTION SYSTEM

[75] Inventors: Stephen E. Headrick; Charles E. Cataldo, both of Huntsville, Ala.

[73] Assignee: United Technologies Corporation, Hartford, Conn.

[21] Appl. No.: 853,246

[22] Filed: Apr. 17, 1986

[51] Int. Cl.⁴ ............................................. B32B 7/00
[52] U.S. Cl. ............................ 428/256; 169/DIG. 2; 244/1 A; 361/218; 428/406
[58] Field of Search ................. 169/DIG. 2; 361/218; 244/1 A; 428/256, 283, 406

[56] References Cited

U.S. PATENT DOCUMENTS

| | | | |
|---|---|---|---|
| 3,480,231 | 11/1969 | Lumm | 244/1 A |
| 3,482,802 | 12/1969 | Lumm | 244/1 A |
| 3,498,572 | 3/1970 | Lumm | 244/1 A |
| 4,522,889 | 6/1985 | Ebneth et al. | 244/1 A |
| 4,556,591 | 12/1985 | Banneck | 244/1 A |
| 4,623,951 | 11/1986 | Du Pont et al. | 361/218 |

*Primary Examiner*—James J. Bell
*Attorney, Agent, or Firm*—A. Dean Olson

[57] ABSTRACT

A multilayered electronics protection system includes a first ablator layer providing thermal protection that is sprayed on to a non-metallic surface of an electronics enclosure. A second ablator layer comprised of highly conductive material is sprayed on to the first ablator layer and provides protection against strategic environmental threats.

15 Claims, 1 Drawing Sheet

MULTILAYERED ELECTRONICS PROTECTION SYSTEM

DESCRIPTION

1. Technical Field

This invention relates to electronics protection systems used in aerospace applications and more specifically to layered protective coating systems providing both thermal protection and shielding from strategic environmental threats.

2. Background Art

Over the years the aerospace industry has developed an array of devices to protect aircraft and spacecraft from a variety of environmental hazards. Due to the continued growth in complexity and sophistication of aerospace and military electronics, these devices must be protected from the severe environments in which they operate. Prior art protection systems have sought to provide thermal protection and electromagnetic interference (EMI) shielding, as well as protection from other environmental hazards.

In the past, thermal protection schemes included ablator materials, applied to a surface by conventional techniques, including spraying. Ablators are well known in the art to provide thermal protection during exit from or reentry to the earth's atmosphere. Prior art ablators usually consist of coatings applied on the outer surface of the aerodynamic structure. They generally comprise glass or ceramic fibers or particles in a suitable binder matrix. Heat generated in the outer surface layer is absorbed by the fusing of the ablator material. Subsequent evaporation or aerodynamic shear loss of the fused product exposes a new surface and the process is repeated. The prior art includes the Marshall Sprayable Ablator (MSA) which provides thermal protection for some elements of the space shuttle.

Current considerations in aerospace design include providing protection for sensitive electronics against potential strategic environmental threats such as laser hardening, electromagnetic radiation, nuclear blasts, and high velocity particle penetration. Thermal ablators have only limited effectiveness against these hazards.

Traditionally, protection from electromagnetic interference was provided by metal enclosures or metal screening which surround the protected electronics. In general, prior art electronic protective systems provided protection against only a single environmental hazard, requiring multiple protective layers to be effective against a plurality of strategic threats.

DISCLOSURE OF INVENTION

An object of the present invention is to provide a multilayered system for protecting electronics systems from strategic environmental threats.

According to the present invention, a multilayered electronics protection system is affixed to a nonmetallic surface enclosing electronics within and includes a first ablator layer that is aoplied to the nonmetallic surface which bonds thereto for providing thermal protection. Also included is a second ablator layer which is applied and adheres to the first ablator laver. The second ablator layer comprises highly conductive material which provides protection against strategic environmental threats as well as providing additional thermal protection.

According to another aspect of the present invention, a fibrous multilayered electronics protection system that is affixed to a nonmetallic surface enclosing electronics circuitry includes a first ablator layer applied to the nonmetallic surface which bonds thereto and which provides thermal protection. High conductivity fibers are positioned on the first ablator layer and which provide protection against strategic environmental threats. A second ablator layer is applied to the first ablator layer and high conductivity fibers or screen, bonding thereto for providing additional thermal protection.

BEST MODE FOR CARRYING OUT THE INVENTION

Figure 1:
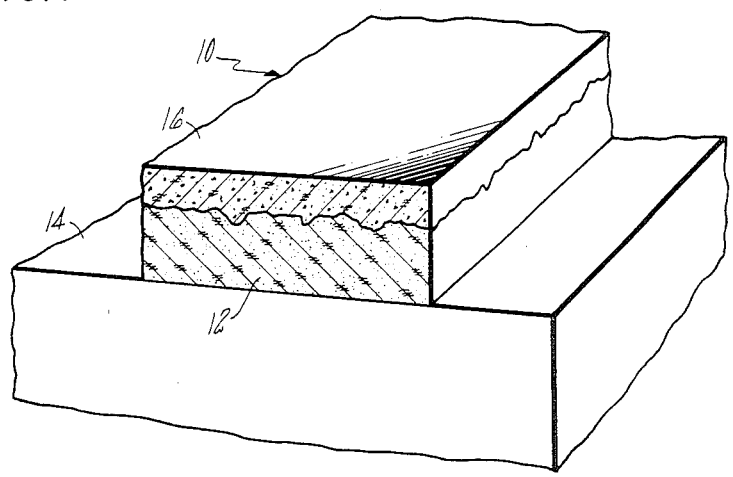
FIG. 1 is an illustration partially in perspective and partially in section of a multilayered electronics protection system provided according to the present invention.

Referring now to FIG. 1, in an illustration partially in section and partially in perspective of a multilayered electronics protection system provided according to the present invention, a multilayered electronics protection system 10 includes first ablator layers 12 which are comprised of a series of conventional sprayable ablator layers, such as the Marshall Sprayable Ablator type 2 (MSA-2) used in the best mode embodiment. The first ablator layers adhere to a surface 14 of an enclosure protecting electronics within. For Space Shuttle applications MSA-2 is applied to the nose cone and forward skirt of the solid rocket boosters in layers approximately ⅛ to ⅜ of an inch thick. However, in the best mode embodiment the enclosure is comprised of nonconducting material, such as carbon fiber, graphite-epoxy, Kevlar-epoxy, or fiberglass.

The Marshall sprayable ablator was developed by NASA at the Marshall Space Flight Center for use with the solid rocket booster assemblv as part of the Space Shuttle program. Although MSA-2 is used in the best mode embodiment, those skilled in the art will note that other equivalent ablators may be substituted. By weight, MSA-2 approximately comprises:

| % By Weight | MSA-2 Components |
|---|---|
| 32.9% | Phenolic Microballoons |
| 12.9% | Glass Eccospheres |
| 1.3% | Chopped Glass Fibers |
| 3.2% | Milled Glass Fibers |
| 3.5% | Bentone 27 Filler |
| 3.1% | Ground Cork |
| 21.5% | Epoxy Resin Catalyst (3M EC-2216A) |
| 21.5% | Epoxy Resin Curing Agent (3M EC-2216B) |

The MSA-2 also comprises solvents such as ethyl alcohol, methylene chloride and perchloroethylene.

As is well known in the art, ablators such as MSA-2 are sprayable and adhere to a variety of surfaces, metallic and nonmetallic. Fully automatic spraying techniques are used to apply the ablator. Typically the ablator material is positioned on the electronics component surface by spraying. A sequence of layers are deposited to build up the final thickness approximately between ⅛ and ⅜ of an inch thick. In addition, a derivation of MSA-2 or equivalent is produced which is trowelable, allowing for small repairs and closeouts.

The multilayered protection system of FIG. 1 also includes a plurality of second ablator layers 16 which are applied on and which adhere to the first layers. These second ablator layers are characterized by high conductivity particles which are mixed in varying ratios relative to the desired protection required with the ablative material of the first ablator layer. In the best mode embodiment the high conductivity material used is powdered metal (copper), although those skilled in the art will note that other equivalent high conductivity materials, such as zinc, aluminum, or silver, may be substituted alone or in combination in a form compatible with the application technique. The amount of powdered metal added varies with the degree of protection desired.

The multilayered electronics protection system provided according to the present invention provides protection against a variety of thermal and strategic environmental threats. Inclusion of the high conductivity particles in the sprayable ablator, such as MSA-2, does not significantly affect the thermal or ablative characteristics of the underlying first ablator layers. The second ablator layers provide protection against such strategic threats as electromagnetic interference. In addition, the ability of a protective layer to ablate and still maintain protection against high energy particles, laser beams or of nuclear blasts is superior to the prior art. Conventional protective measures configured alone, such as metallic screening melt or dissipate in a nonuniform, unpredictable fashion unlike the present invention. Moreover, as these protective layers are destroyed the adjacent and underlying material may be seriously compromised.

Certain strategic threats such as a nuclear blast or high energy particles may generate a plurality of strategic threats simultaneously. Strategic environmental protection systems of the prior art are designed to provide protection against a single or limited number of hazards, requiring a compilation of several compatible systems. A multilayered electronics protection system provided according to the present invention will protect enclosed electronics against a multitude of strategic environmental threats, for example, such as presented by a nuclear blast (hot moving air, radiation, EMI). Moreover, a multilayered electronics protection system provided according to the present invention allows an engineer to configure the particular protection system exactly to the expected strategic threats by adjusting the concentration, constituents as well as the thickness of the second ablator layers in conjuction with the first ablator layers. Moreover, the layers can be juxtaposed depending on the anticipated order in which the hazards are to be encountered.

In addition, a multilayered electronics protection system provided according to the present invention allows the substitution of lightweight, high strength materials as substitutes for metallic enclosures for electronic systems. A multilayered electronics protection system as shown in FIG. 1 can be applied to a plurality of nonmetallic substrates such as carbon fiber and fiberglass in various binder matrices and still provide protection against electromagnetic interference.

Other anticipated uses for the multilayered electronics protection system provided according to the present invention include thermal and data sensor protection on ships, submarines, and field weapons.

Figure 2:
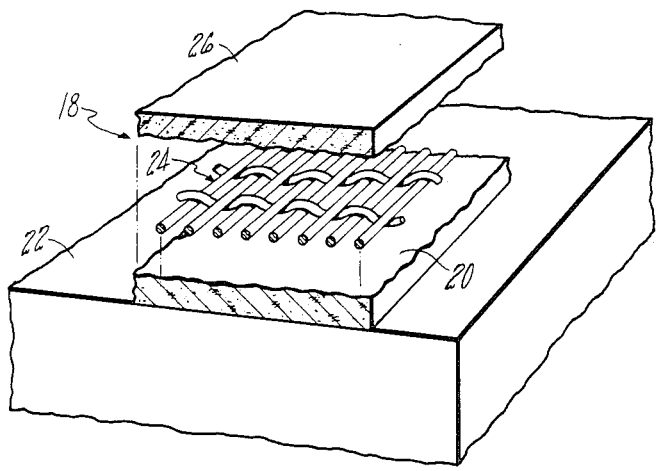
FIG. 2 is an exploded illustration partially in perspective and partially in section of an alternative embodiment of the multilayered electronics protection system of FIG. 1.

FIG. 2 is an exploded illustration partially in section and partially in perspective of an alternative embodiment of the multilayered electronics protection system of FIG. 1. The alternative embodiment 18 includes a plurality of first ablator layers 20 which are applied to a nonmetallic surface 22 such as those described hereinabove with respect to FIG. 1. Metal screening 24 is then located by conventional techniques on the first ablator layers. The metal screening can be of a conventional type such as that of copper, silver or aluminum and is selected using conventional criteria to provide the desired amount of protection against electromagnetic interference. Typically the screen comprises aluminum or cooper of fine mesh. Those skilled in the art will note also that any high conductivity screening or fibers can be equivalently substituted.

Second ablator layers 26 are applied to the high conductivity screening and first ablator layers, burying the screening therein. The second ablator layers may be comprised simply of thermal ablative material such as MSA-2 as shown in FIG. 2. However, those skilled in the art will note that metal screening may be used in conjunction with second ablator layers which have high conductivity materials such as metal powder mixed therewith. Those skilled in the art will also note that more complex multilayered protection systems can be configured with alternate layers of screening and thermal ablative material selected according to the expected strategic environmental hazards.

Similarly, although the invention has been shown and described with respect to a best mode embodiment thereof, it should be understood by those skilled in the art that various other changes, omissions and additions thereto may be made therein without departing from the spirit and scope of the invention.

We claim:

1. A multilayered electronics protection system affixed to a non-metallic surface enclosing electronics comprising:
   first ablator layer means applied to the non-metallic surface, bonding thereto, providing thermal protection;
   second ablator layer means applied on and adhering to said first ablator layer, including highly conductive material providing protection against strategic environmental threats and additional thermal protection.

2. The multilayered electronics protection system of claim 1, wherein said first and second ablator layers are sprayable.

3. The multilayered electronics protection system of claim 1, wherein said highly conductive material comprises metal powder.

4. The multilayered electronics protection system of claim 3, wherein said metal powder is selected from the group zinc, copper, silver and aluminum.

5. The multilayered electronics protection system of claim 1, wherein said highly conductive material comprises a combination powder including at least two elements selected from the group copper, silver, aluminum and zinc.

6. A fibrous multilayered electronics protection system affixed to a non-metallic surface enclosing electronics hardware comprising:

first ablator layer means applied to the non-metallic surface, bonding thereto, providing thermal protection;

high conductivity fiber means positioned on said first ablator layer means providing protection against strategic environmental threats, and;

second ablator layer means applied to said first ablator means and said high conductivity fiber means, bonding thereto, providing thermal protection.

7. The fibrous multilayered electronics protection system of claim 6, wherein said high conductivity fiber comprises aluminum.

8. The fibrous multilayered electronics protection system of claim 6, wherein said high conductivity fiber comprises copper.

9. The fibrous multilayered electronics protection system of claim 6, wherein said high conductivity fiber comprises metallic screening.

10. The fibrous multilayered electronics protection system of claim 6, wherein said first and second ablator layers are sprayable.

11. The fibrous multilayered electronics protection system of claim 6, wherein said first and second ablator layers comprise phenolic microspheres, glass microspheres, chopped glass fibers, milled glass fibers, filler, ground cork, epoxy resin catalyst and epoxy resin curing agent.

12. The fibrous multilayered electronics protection system of claim 6, wherein said second ablator layer additionally comprises high conductivity material.

13. The fibrous multilayered electronics protection system of claim 12, wherein said high conductivity material comprises a metal powder.

14. The fibrous multilayered electronics protection system of claim 13, wherein said high metal power is selected from the goup zinc, copper, silver or aluminum.

15. The fibrous multilayered electronics protection system of claim 13, wherein said high conductivity material compries a combination metal powder including at least two elements selected from the group zinc, copper, silver or aluminum.

* * * * *